US011156923B2

(12) United States Patent
Cekli et al.

(10) Patent No.: US 11,156,923 B2
(45) Date of Patent: Oct. 26, 2021

(54) LITHOGRAPHIC METHOD AND LITHOGRAPHIC APPARATUS

(71) Applicant: ASML Netherlands B.V., Veldhoven (NL)

(72) Inventors: Hakki Ergün Cekli, Singapore (SG); Xing Lan Liu, Ukkel (BE); Stefan Cornelis Theodorus Van Der Sanden, Nijmegen (NL); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 423 days.

(21) Appl. No.: 15/557,802

(22) PCT Filed: Dec. 10, 2015

(86) PCT No.: PCT/EP2015/079282
§ 371 (c)(1),
(2) Date: Sep. 12, 2017

(87) PCT Pub. No.: WO2016/146217
PCT Pub. Date: Sep. 22, 2016

(65) Prior Publication Data
US 2018/0292761 A1 Oct. 11, 2018

(30) Foreign Application Priority Data
Mar. 13, 2015 (EP) .................... 15158935

(51) Int. Cl.
G03F 7/20 (2006.01)
G03F 9/00 (2006.01)

(52) U.S. Cl.
CPC .......... G03F 7/70633 (2013.01); G03F 7/705 (2013.01); G03F 7/70258 (2013.01); G03F 7/70358 (2013.01); G03F 9/7046 (2013.01)

(58) Field of Classification Search
CPC .. G03F 7/70633; G03F 7/70358; G03F 7/705; G03F 7/70508; G03F 7/70525;
(Continued)

(56) References Cited

U.S. PATENT DOCUMENTS 7,683,351 B2  3/2010  Mos et al.
7,791,727 B2  9/2010  Den Boef et al.
(Continued)

FOREIGN PATENT DOCUMENTS

JP  07-057991    3/1995
JP  2001-338860  12/2001
(Continued)

OTHER PUBLICATIONS

International Search Report and Written Opinion dated Apr. 28, 2016 in corresponding International Patent Application No. PCT/EP2015/079282.

(Continued)

Primary Examiner — Christina A Riddle
(74) Attorney, Agent, or Firm — Pillsbury Winthrop Shaw Pittman LLP

(57) ABSTRACT

A method includes exposing number of fields on a substrate, obtaining data about a field and correcting exposure of the field in subsequent exposures. The method includes defining one or more sub-fields of the field based on the obtained data. Data relating to each sub-field is processed to produce sub-field correction information. A subsequent exposure of the one or more sub-fields is corrected using the sub-field correction information. By controlling a lithographic apparatus by reference to data of a particular sub-field within a field, overlay error can be reduced or minimized for a critical feature, rather than being averaged over the whole field. By (Continued)

controlling a lithographic apparatus with reference to a sub-field rather than only the whole field, a residual error can be reduced in each sub-field.

20 Claims, 11 Drawing Sheets

(58) Field of Classification Search
CPC ............. G03F 7/70533; G03F 7/70608; G03F 7/70625; G03F 7/70616; G03F 7/70666; G03F 7/70675; G03F 7/70683; G03F 7/7085; G03F 9/7046
USPC ............... 355/52, 53, 55, 67–71, 72, 75, 77; 250/492.1, 492.2, 492.22, 493.1, 548
See application file for complete search history.

(56) References Cited

U.S. PATENT DOCUMENTS

| | | |
|---|---|---|
| 8,976,355 B2 | 3/2015 | Van Der Sanden et al. |
| 9,177,219 B2 | 11/2015 | Tel et al. |
| 2003/0035090 A1 | 2/2003 | Imai et al. |
| 2006/0033921 A1 | 2/2006 | Den Boef et al. |
| 2008/0128642 A1 | 6/2008 | Mos et al. |
| 2010/0110401 A1 | 5/2010 | Chung |
| 2011/0038704 A1 | 2/2011 | Hawryluk et al. |
| 2011/0205511 A1* | 8/2011 | Padiy .................. G03F 7/70525 355/53 |
| 2011/0216294 A1 | 9/2011 | Menchtchikov et al. |
| 2012/0008127 A1 | 1/2012 | Tel et al. |
| 2013/0230797 A1 | 9/2013 | Van Der Sanden et al. |

FOREIGN PATENT DOCUMENTS

| | | |
|---|---|---|
| JP | 2005-032957 | 3/2005 |
| JP | 2008-147654 | 6/2008 |
| JP | 2010-512001 | 4/2010 |
| JP | 2013-074294 | 4/2013 |
| JP | 2013-520019 | 5/2013 |
| KR | 20110016824 | 2/2011 |
| WO | 2008/066375 | 6/2008 |
| WO | 2011/101183 | 8/2011 |

OTHER PUBLICATIONS

Yishai, Michael Ben et al., "An IntenCD map of a reticle as a feed-forward input to DoseMapper", Proceedings of SPIE, vol. 7028, pp. 70283H-1-70283H-11, (2008).

Japanese Office Action issued in corresponding Japanese Patent Application No. 2017-566192, dated Jul. 24, 2018.

Korean Office Action issued in corresponding Korean Patent Application No. 10-2017-7026655, dated Mar. 26, 2019.

Korean Office Action issued in corresponding Korean Patent Application No. 10-2019-7032407, dated Jan. 20, 2021.

* cited by examiner

LITHOGRAPHIC METHOD AND LITHOGRAPHIC APPARATUS

CROSS-REFERENCE TO RELATED APPLICATIONS

This application is the U.S. national phase entry of PCT patent application no. PCT/EP2015/079282, which was filed on Dec. 10, 2015, which claims the benefit of priority of European patent application no. 15158935.5, which was filed on Mar. 13, 2015, and which is incorporated herein in its entirety by reference.

FIELD

The present invention relates to a method of controlling a lithographic process. In particular, the invention relates to a method for reducing overlay errors on a substrate by processing data relating to sub-fields of a field. The invention further relates to lithographic apparatus configured for performing such methods, and to computer program products for use in controlling the lithographic apparatus to perform the methods.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a product pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate. The pattern can be transformed into functional product features by further processing steps.

A key performance parameter of the lithographic process is the overlay error. This error, often referred to simply as "overlay" is the error in placing a product features in the correct position relative to features formed in previous layers. As product feature become all that much smaller, overlay specifications become ever tighter.

Currently the overlay error is controlled and corrected by means of correction models described for example in US2013230797A1. Advanced process control techniques have been introduced in recent years and use measurements of metrology targets applied to substrates alongside the applied device pattern. These targets allow overlay to be measured using a high-throughput inspection apparatus such as a scatterometer, and the measurements can be used to generate corrections that are fed back into the lithographic apparatus when patterning subsequent substrates. Examples of advanced process control (APC) are described for example in US2012008127A1. The inspection apparatus may be separate from the lithographic apparatus. Within the lithographic apparatus wafer correction models are conventionally applied based on measurement of overlay targets provided on the substrate, the measurements being as a preliminary step of every patterning operation. The correction models nowadays include higher order models, to correct for non-linear distortions of the wafer. The correction models may also be expanded to take into account other measurements and/or calculated effects such as thermal deformation during a patterning operation While the use of higher order models may be able take into account more effects, however, such models require that more position measurements are made. Further, higher order correction models require more computing power and/or take more time to calculate. Thus, using an advanced correction model may in certain circumstances be feasible in theory, but may not be economically viable in practice since it would negatively influence throughput of the lithographic process (i.e. wafers per hour). Additionally, more advanced correction models may be of limited use, if the patterning apparatus itself does not provide control of corresponding parameters during patterning operations. Furthermore, even advanced correction models may not be sufficient or optimized to correct for certain overlay errors.

SUMMARY

It is desirable to improve overlay control and correction potential without adversely impacting throughput. It is further desirable that such improvement can be obtained by using existing lithographic methods and apparatuses. This enables existing lithographic apparatuses to be upgraded, thereby extending their effective lifetimes.

According to an aspect of the invention, there is provided a lithographic method, the method comprising:
  exposing a number of fields on a substrate;
  obtaining data about a field;
  defining a sub-field of the field based on the obtained data;
  processing data relating to the sub-field to produce sub-field correction information; and
  correcting exposure of the sub-field using the sub-field correction information.

In some embodiments, the data obtained is the fingerprint for the field. In a particular embodiment, the sub-field is a line of data points in the fingerprint. The data may additionally or alternatively comprise topography, layout, structure or simulation data.

In one embodiment, the lithographic method further comprises processing data relating to a number of sub-fields to produce sub-field correction information for each sub-field and correcting exposure of each sub-field using correction information for that sub-field.

The invention further provides a lithographic apparatus for implementing the method as set forth above.

The invention further provides a computer program product containing one or more sequences of machine-readable instructions configured to control a lithographic apparatus to perform the method as set forth above.

The invention further provides a computer program product containing one or more sequences of machine-readable instructions configured to control a lithographic apparatus to perform the method as set forth above, wherein the computer program product comprises a user interface.

These and further features and advantages of the invention will be apparent to the skilled reader from a consideration of the detailed description of examples that follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
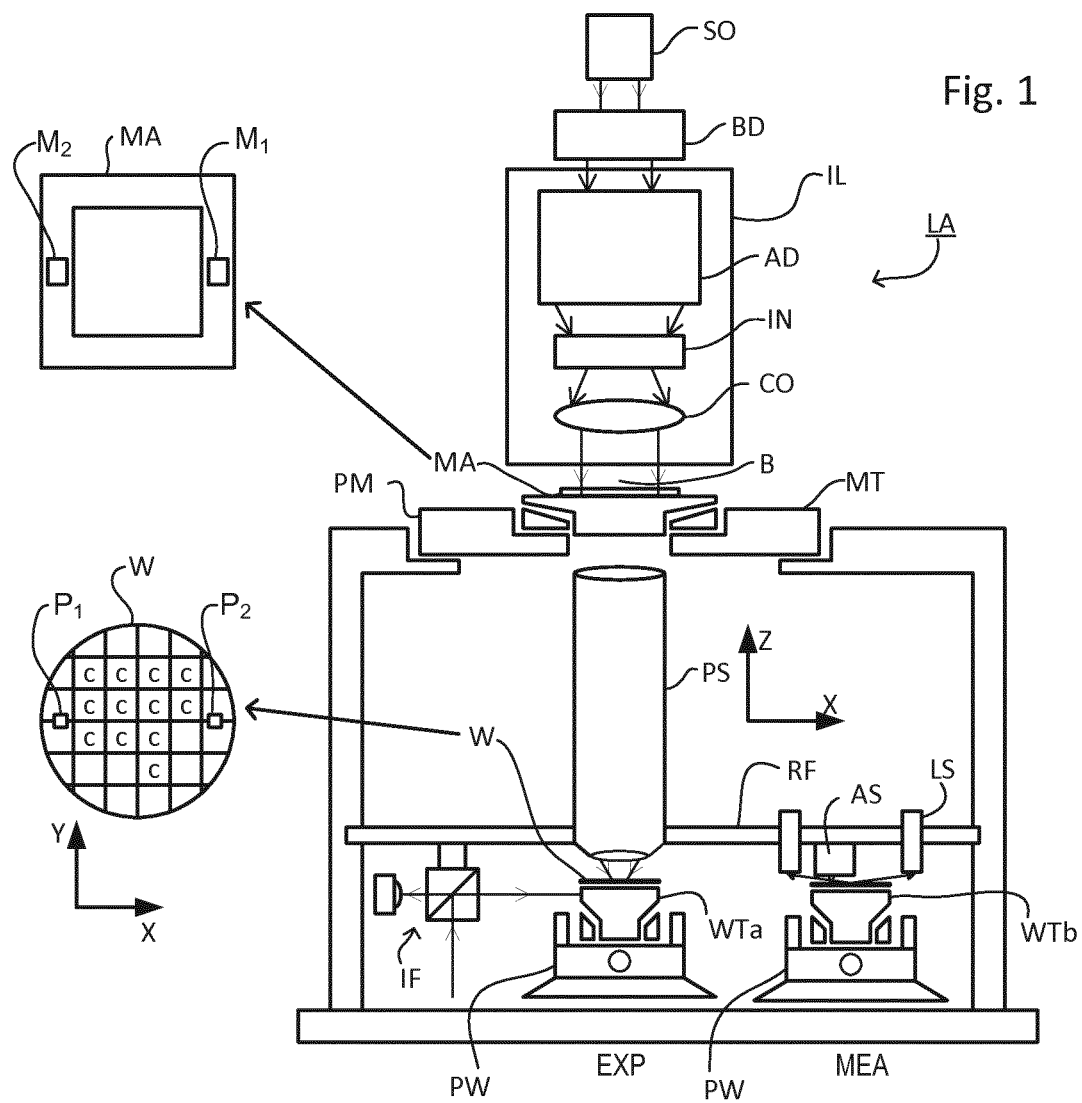
FIG. 1 depicts a lithographic apparatus according to an embodiment of the invention.

FIG. 1 schematically depicts a lithographic apparatus. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
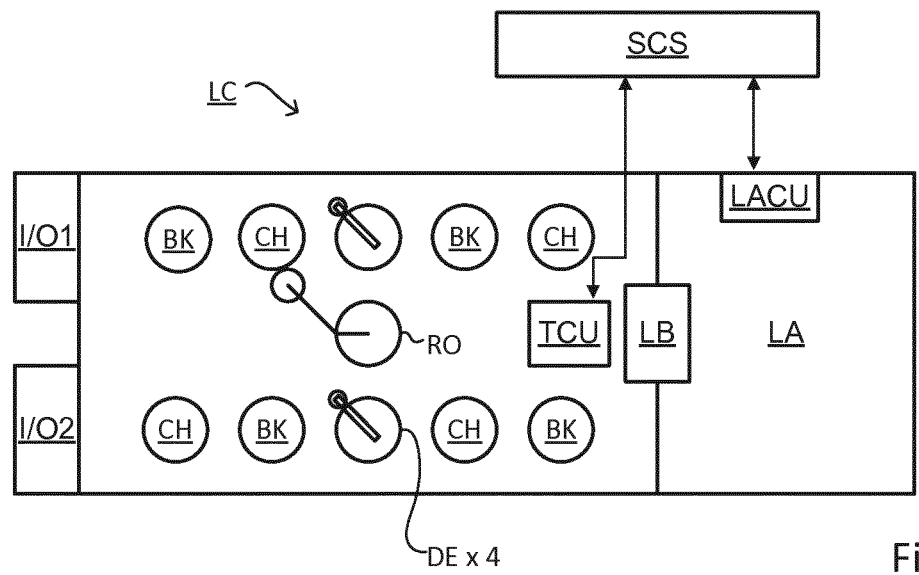
FIG. 2 depicts a lithographic cell or cluster incorporating the apparatus of FIG. 1.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
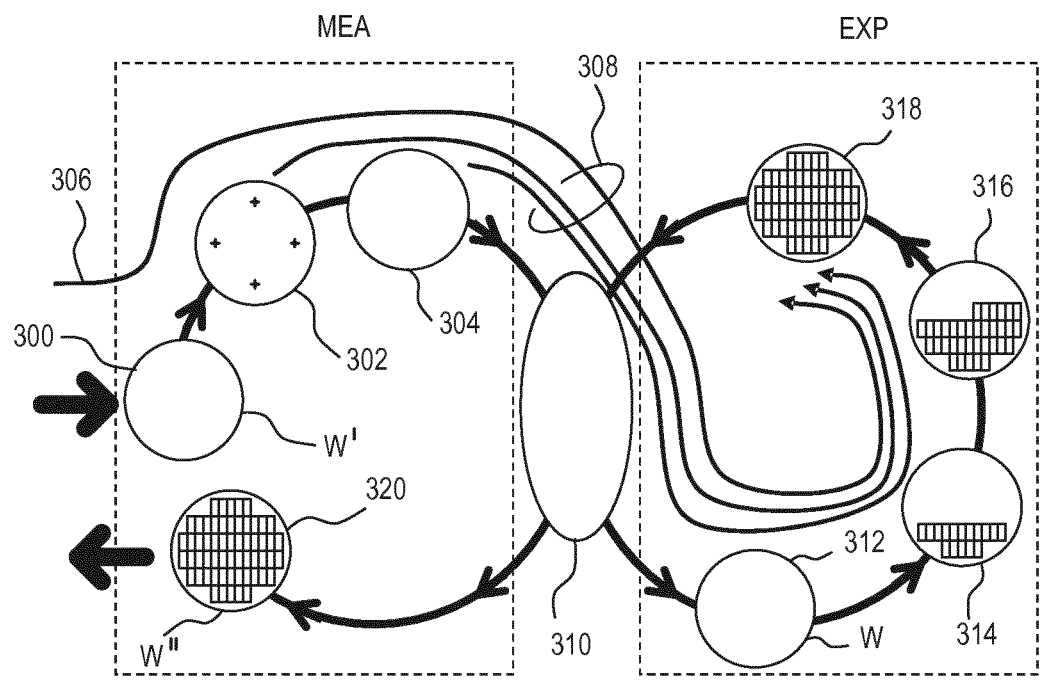
FIG. 3 illustrates schematically measurement and exposure processes in the apparatus of FIG. 1, according to known practice and modified in accordance with an embodiment of the present invention.

FIG. 3 illustrates the steps to expose target portions (e.g. dies) on a substrate W in the dual stage apparatus of FIG. 1.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 300, a new substrate W' is loaded to the apparatus by a mechanism not shown. These two substrates W, W' are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 302, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 304, a map of wafer height (Z) against X-Y position is measured also using the level sensor LS. Conventionally, the height map is used only to achieve accurate focusing of the exposed pattern. As will be explained further below, the present apparatus uses height map data also to supplement the alignment measurements.

When substrate W' was loaded, recipe data 306 were received, defining the exposures to be performed, and also properties of the wafer and the patterns previously made and to be made upon it. To these recipe data are added the measurements of wafer position, wafer grid and height map that were made at 302, 304, so that a complete set of recipe and measurement data 308 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of a correction model. These parameters and the correction model will be used during the exposure operation to correct positions of patterns applied in the current lithographic step. A conventional correction model might comprise four, five or six parameters, together defining translation, rotation and scaling of the 'ideal' grid, in different dimensions. As described further in US 2013230797A1, advanced models are known that use more parameters.

At 310, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 302, 304 for the substrate W (formerly W') in control of the exposure steps. At step 312, reticle alignment is performed using the mask alignment marks M1, M2. In steps 314, 316, 318, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 320, to undergo etching or other processes, in accordance with the exposed pattern.

Even when advanced correction models are used, errors inevitably remain in the overlay performance of the lithographic apparatus. An individual lithographic apparatus may also perform differently than other ones processing the same substrate. In order that the substrates that are exposed by the lithographic apparatus are exposed correctly and consistently, it is desirable to inspect exposed substrates to measure performance parameters such as overlay errors between subsequent layers, line thicknesses, critical dimensions (CD), etc.

An inspection apparatus is therefore used to determine the properties of the substrates independently of the alignment sensors AS, and in particular, how the properties of different substrates or different layers of the same substrate vary from layer to layer. The inspection apparatus (not shown in FIG. 2) may be integrated into the lithographic apparatus LA or the lithocell LC or may be a stand-alone device. It may be a scatterometer, for example an angle-resolved scatterometer of the time described in published US patent application US2006033921A1.

The inspection apparatus can also be used in an advanced process control (APC) system to calibrate individual lithographic apparatus and to allow different tools to be used more interchangeably. Improvements to the apparatus's focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example implements three main process control loops. The first loop provides the local control of the lithography apparatus using the stability module and monitor wafers. The second (APC) loop is for local scanner control on-product (determining focus, dose, and overlay on product wafers).

The third control loop is to allow metrology integration into the second (APC) loop (e.g., for double patterning). All of these loops use measurements made by the inspection apparatus, in addition to the measurements made in the during the actual patterning operations of FIG. 3.

As explained above, the diagnostic methods and apparatus disclosed herein employ object data that is data measured from points distributed spatially over each product unit. In the example of a lithographic production facility where the product units are semiconductor substrates (wafers), a particularly interesting source of comprehensive object data is the set of measurements performed in the lithographic apparatus to characterize each wafer and the patterns previously deposited upon it. These measurements are used to obtain parameters for correction models, that are used in a new patterning step to control accurately the positioning of patterns applied in relation to features already present Standard intra-field and inter-field correction models have six parameters (effectively three per direction X & Y) and in addition there are more advanced correction models. On the other hand, for the most demanding processes currently in use and under development, to achieve the desired overlay performance requires more detailed corrections. While standard models might use fewer than ten parameters, advanced correction models typically use more than 15 parameters, or more than 20 parameters.

Figure 4:
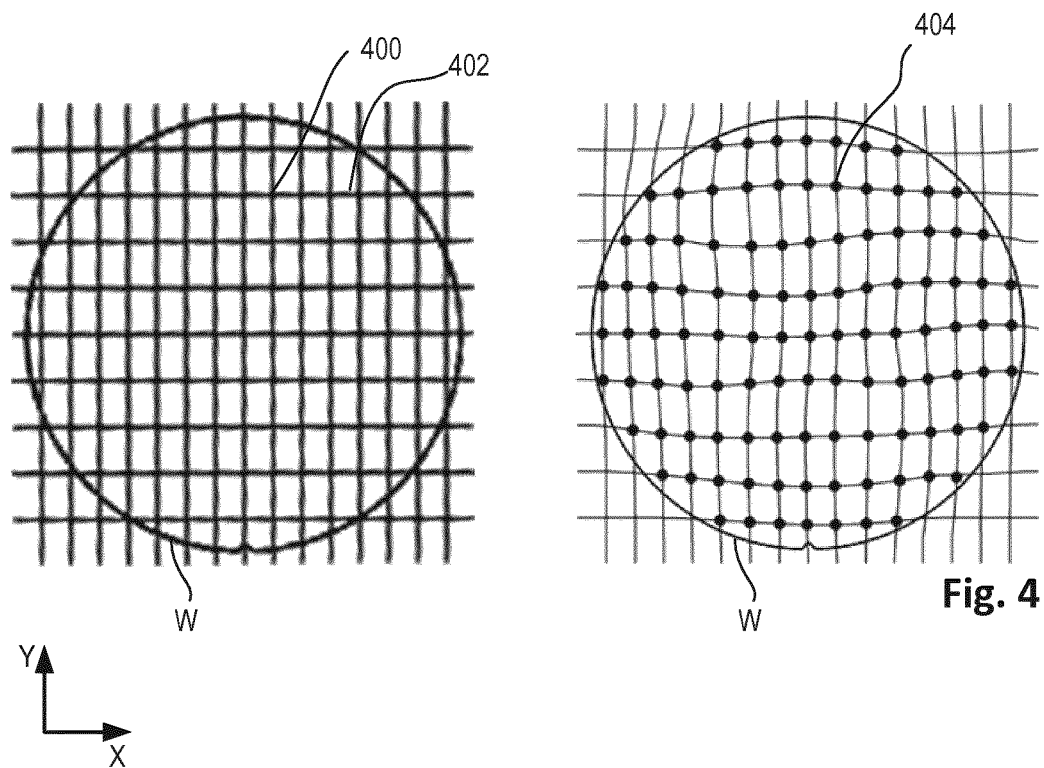
FIGS. 4 & 5 illustrate the principles of advanced alignment measurements and wafer grid corrections applied in a lithographic apparatus of a production facility.
Figure 5:
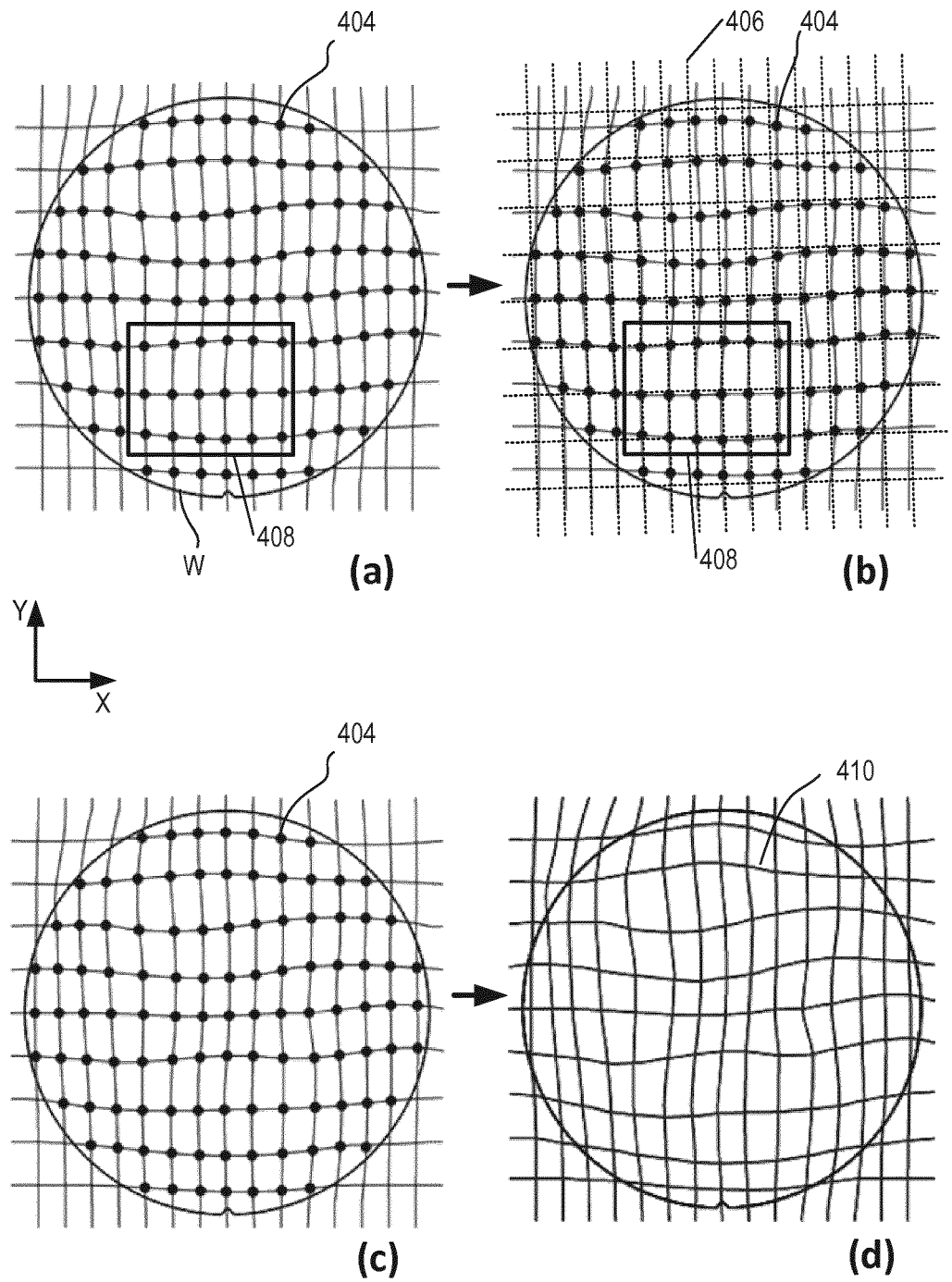

FIGS. 4 & 5 illustrate the form of correction information that can be used to correct for wafer grid distortion as measured by the alignment sensor AL on alignment marks (targets) 400 in a previous layer on wafer (substrate) W. Each target has a nominal position, defined usually in relation to a regular, rectangular grid 402 with axes X and Y. Measurements of the real position 404 of each target reveal deviations from the nominal grid. The alignment marks may be provided within device areas of the substrate, and/or they may be provided in so-called "scribe lane" areas between device areas.

As illustrated in FIG. 5 the measured positions 404 of all the targets can be processed numerically to set up a model of a wafer grid for this particular wafer. This correction model is used in the patterning operation to control the position of the patterns applied to the substrate. FIG. 5(a) shows the measured positions 404 of all the targets. A highlighted region 408 is also shown. FIG. 5(b) shows an example wherein a standard correction model with six parameters is used to model the wafer grid. The parameters of the modeled wafer grid 406 are modified to fit the modeled wafer grid to the measured targets 404, which are shown for reference. Since the standard correction model only has six parameters, it is not possible to fit the modeled wafer grid perfectly to all of the measured positions of the targets on the wafer W. As can be seen in FIG. 5(b), the modeled wafer grid 406 is fitted closely to the measured targets within the region of the highlighted area 408. However, outside the highlighted area, the modeled wafer grid deviates from the measured grid. In other terms, the modeled wafer grid 406 has been optimized for the highlighted area 408, to ensure that the deviations inside the area are small. Thus, modeled wafer grids are normally optimized for areas with critical components or products, which require that the overlay error is small. Less critical products or components can be placed outside the highlighted area. It is of course to be noted that the position of the highlighted area in the present example is exemplary only, and that the modeled wafer grid can be optimized for any appropriate location on the wafer. Of course, for certain processes, certain area shapes are not possible. In such cases, the design layout of the substrate can be adjusted to make it easier to position the critical components within an area with a particular shape FIG. 5(c) shows the measured positions 404 of all the targets in a manner similar to FIG. 5(a), but without the highlighted area. In the exemplary modeled wafer grid 410 illustrated in FIG. 5(d), the straight lines of the nominal grid have become curves, indicating use of a higher order (advanced) correction model. The use of a higher order correction model allows the modeled wafer grid to be matched more closely to the measured grid than the standard correction model. However, even in this case residual deviations (not shown) will remain in practice. Even when a higher order model is used, there can still be scope to define specific areas as critical areas, and optimize the model to minimize deviations in those areas. Since more advanced correction models have more parameters, it is necessary to perform more measurements on a wafer, which in turn requires more time for performing these measurements. This reduces throughput of wafers in a production situation, which is not desirable.

It goes without saying that the distortions illustrated are exaggerated compared to the real situation. Alignment is a unique part of the lithographic process, because it is the correction mechanism able to correct for deviations (distortions) in each exposed wafer.

Certain components of the overlay on each substrate will be truly random in nature. However, other components will be systematic in nature, whether their cause is known or not. Where similar substrates are subject to similar patterns of overlay error, the patterns of error may be referred to as "fingerprints" of the lithographic process. Overlay errors can broadly be categorized into two distinct groups:
 1) contributions which vary across an entire substrate, wafer are known in the art as inter-field fingerprints.
 2) contributions which vary similarly across each target portion (field) of a substrate or wafer are known in the art as intra-field fingerprints.

Advanced correction models can be applied to correct both the inter-field fingerprints and intra-field fingerprints. Each fingerprint may have components due to different causes, e.g. a scanner may have a fingerprint unique to itself, or an etching process may have a particular fingerprint. All these components of inter-field fingerprints and intra-field fingerprints combine into the error actually present on a given substrate.

However, while an advanced correction model may, for example, include 20-30 parameters, scanners currently in use may not have actuators which correspond to one or more of the parameters. Hence, only a subset of the entire set of parameters of the model can be used at any given time. Additionally, as the advanced models require many measurements, it is not desirable to use these models in all situations, since the time required to perform the necessary measurements reduces throughput.

Overlay Error Sources and Reduction

Some of the main contributors to overlay errors include, but are not limited to, the following:
- scanner-specific errors: these may arise from the various subsystems of the scanner used during exposure of the substrate, in effect creating a scanner-specific fingerprint;
- process induced wafer deformation: the various processes performed on the substrates may deform the substrate or wafer;
- illumination setting differences: these are caused by the settings of the illumination system, such as the shape of the aperture, lens actuator positioning, etc.;
- heating effects—heating induced effects will differ between various sub-fields of a substrate, in particular for substrates wherein the various sub-fields include different types of components or structures;
- reticle writing errors: errors may be present already in the patterning device due to limitations in its manufacture; and
- topography variations: substrates may have topography (height) variations, in particular around the edges of wafers The inventors have recognized that it is possible to reduce the overlay error without using a higher-order correction model. By applying a correction model to one or more specific portions of a particular field, rather than to the entirety of a particular field, overlay error can be reduced. These specific portions will in the following be referred to as sub-fields (but may also in the art, e.g., be referred to as subzones).

For modeling the sub-fields, one may for example use only a standard correction model. Effectively, the parameters of the model are changed one or more times within each scanning operation, so that the corrections are customized to the fingerprint of each part of the field. Thus, overlay error can be reduced without requiring use of the more advanced correction models. However, by using a standard correction model in accordance with the method of the invention, the throughput of wafers is not adversely impacted. Provided the patterning apparatus formed by projection system PS and associated positioning systems in the apparatus of FIG. 1 can be controlled to vary the model parameters for different portions of each field, the new type of correction can be implemented merely by suitable changes in the alignment and control software.

Modeling overlay error of individual sub-fields of a field can be carried out instead of modeling the overlay error of the field in its entirety, or it can be modeled in addition to modeling the field in its entirety. While the latter requires more processing time, since both the field as well as the sub-fields within it are modeled, it allows for the correction of error sources which relate to a particular sub-field only as well as error sources which relate to the entirety of the field. Other combinations, such as modeling the entire field and only certain sub-fields, are of course possible.

Figure 6:
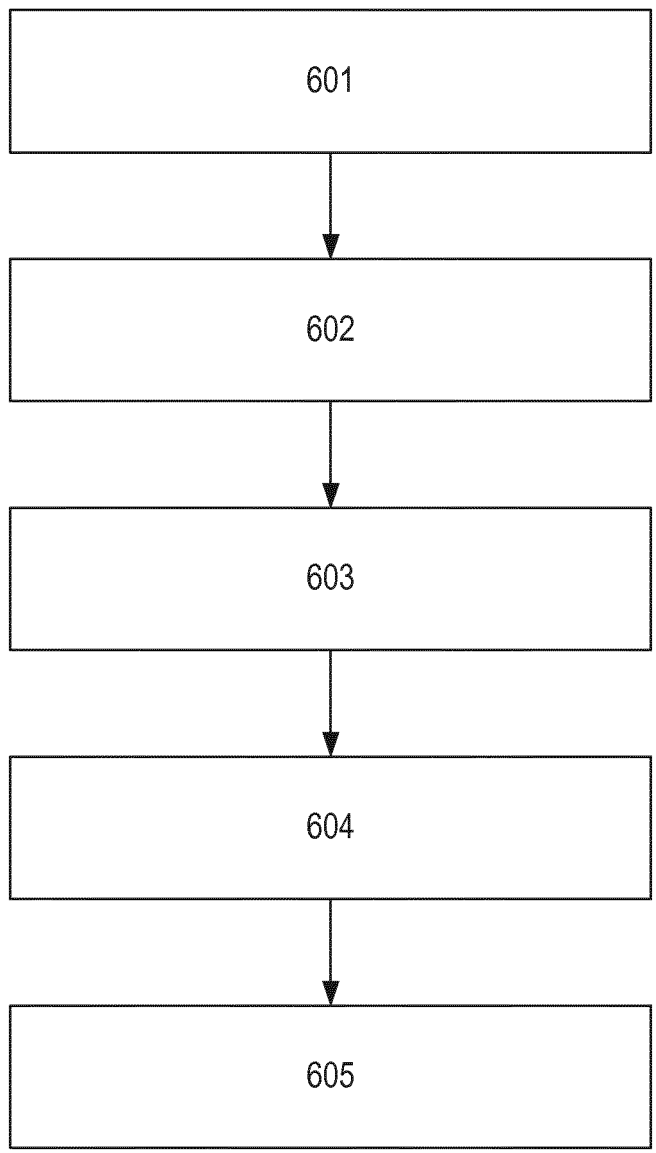
FIG. 6 is a flowchart of a process implementing one embodiment of the present invention.

With reference to FIG. 6, a lithographic method for correcting overlay errors according to an embodiment of the present invention is illustrated. The reference numerals in this figure refer to the following steps, each of which will be explained in more detail in the following:
- 601: Exposing at least one field on a substrate;
- 602: Performing measurements on the field;
- 603: Determining sub-field;
- 604: Processing data relating to the sub-field to produce sub-field correction information; and
- 605: Correcting exposure of the sub-field using the sub-field correction information;

It is to be noted that, although the above steps are depicted in FIG. 6 and discussed below in a particular order, some of these steps may be performed in a different order, or may be performed simultaneously In step 601, a lithographic exposure process is carried out on one or more substrates using a scanner. The resulting exposed substrate will contain overlay errors arising from one or several of the causes described previously. The substrate can be a product substrate, or it can be an initial "prototype" substrate made prior to start of production. In step 602, measurements are performed at specific points on the substrate(s). The number and distribution of measurement points can be varied in any suitable fashion. For example, measurement points can be arranged so as to be clustered around a particular area of interest, or they can be arranged in a grid pattern. In another embodiment, the measurement points may be randomly distributed. The measurements will reveal both inter-field fingerprints as well as intra-field fingerprints. In step 603, at least one sub-field is defined. The sub-field can be defined in a number of ways, as will be discussed in more detail below. In step 604, the obtained measurement results are processed for each sub-field of the field, in order to determine any corrections necessary to correct for any overlay errors. This is done by using a correction model as described above. In step 605, in the exposure of further substrates, the exposure of a given sub-field is corrected based on the obtained correction information for that sub-field, in addition to (or instead of) the corrections based on the intra-field fingerprint modeled for the whole field. The exposure information is normally contained in the recipe data 306 described with reference to FIG. 3 above. As a result, the scanner is enabled to control the exposure of a product substrate with greater accuracy than known.

Individual sub-fields can be defined in a number of different ways. For example, a sub-field can be defined by a user, either entirely manually or aided by measurement data. The user can, for example, define the sub-field by using a user interface on the lithographic apparatus or on the supervisory control system or on a suitable remote device.

Figure 7:
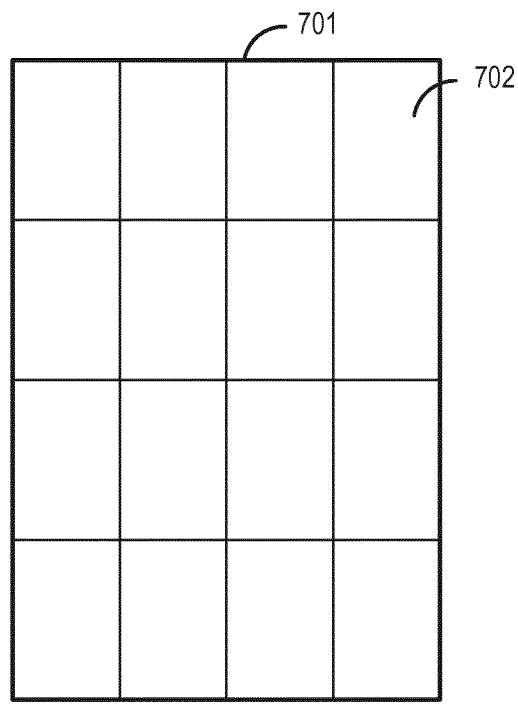
FIG. 7 is schematic illustration of a field divided into sub-fields.
Figure 7:
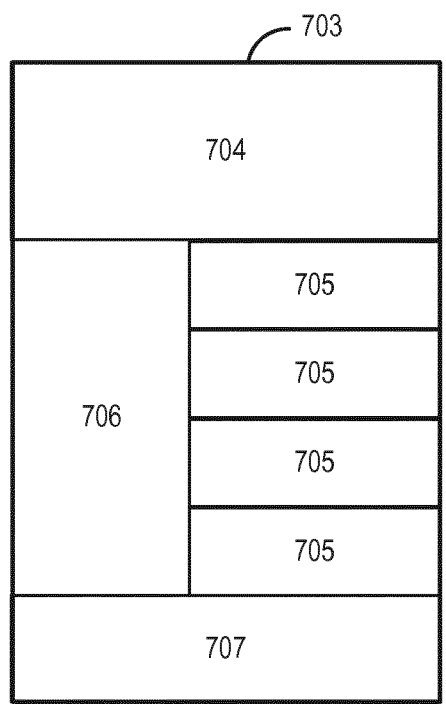

FIG. 7 shows an exemplary field 701 which is divided into a number of equally sized sub-fields 702. Such a division of a field is useful if the field, for example, contains a number of equally sized and spaced products, product features, or product areas. However, sub-fields can equally well be defined so as to contain individual components or products which are not equal in size or distributed evenly across the field. FIG. 7 shows a field 703 on which a product will be formed with a number of different components occupying different product areas. As an example, each field on the substrate may have a graphics processor in sub-field 704, a processor core in each of sub-fields 705, a cache in sub-field 706 and a system memory controller in sub-field 707. Each sub-field is defined so as to contain one of these components. By defining sub-fields to hold one product each, the overlay error can be corrected individually for each product, even if the products are not evenly distributed or equal in size. This minimizes the deviations caused by the standard correction model since the correction model can be optimized for the part of the sub-field in which the product is located, as discussed with reference to FIG. 5 above.

Figure 8:
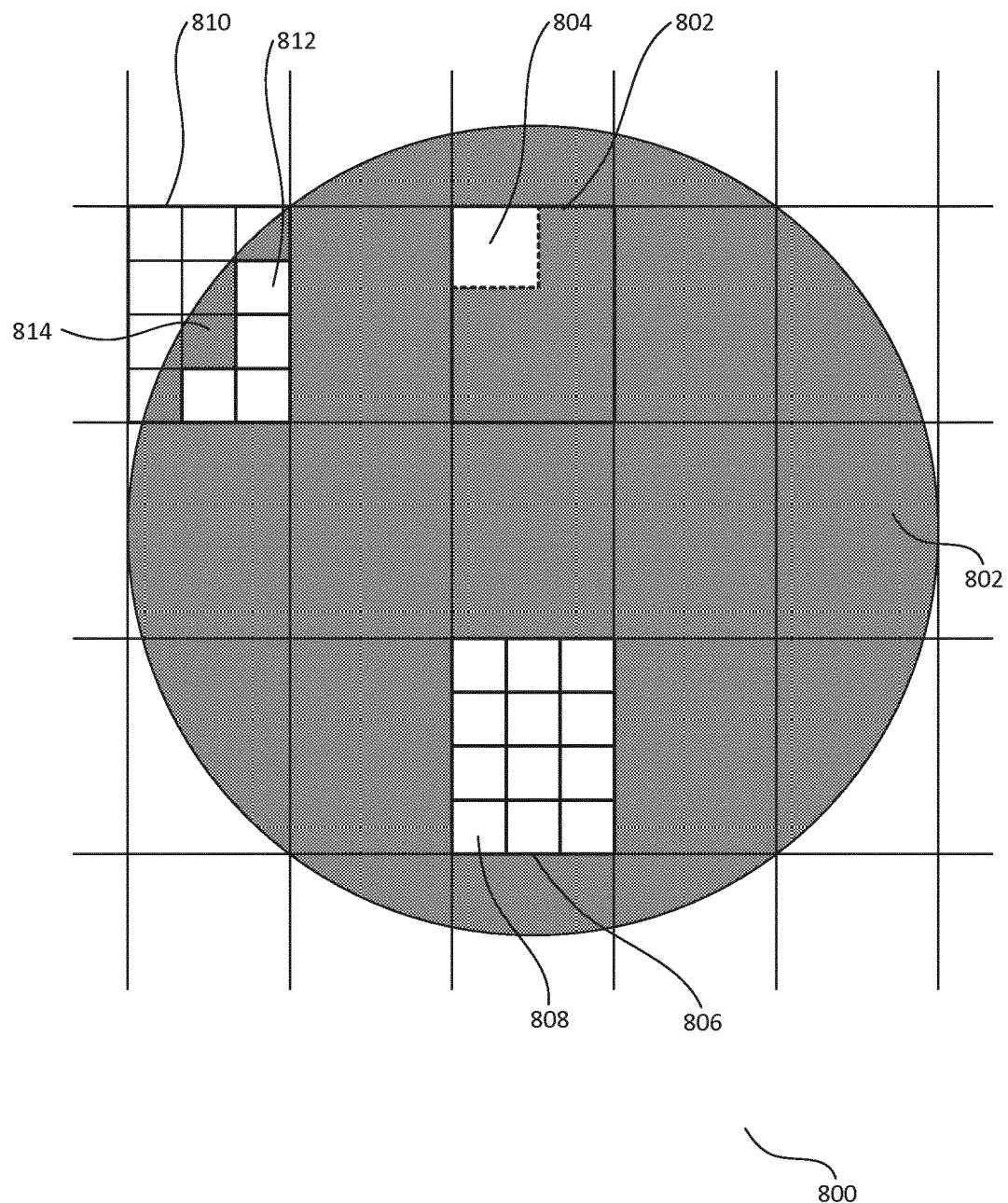
FIG. 8 illustrates schematically a wafer divided into a number of fields, as well as different sub-fields divisions.

In order to further optimize the method, the definition of sub-fields may also take additional factors into account, such as the location of a particular field on the individual substrate. FIG. 8 illustrates an exemplary wafer 800, which is divided into a number of fields 802. Different fields will be used to illustrate different techniques possible within the scope of the present disclosure. In a first field 804, a sub-field has been defined, as explained above, so as to contain a critical product or product area. The portion of the first field that is outside the sub-field contains only less-critical products or product areas, which are tolerant of larger overlay areas. This approach uses the standard correction model as described above, and is advantageous if only a single area of a field is intolerant of overlay error since it minimizes measurement and calculation time.

A second field 806 is divided into a number of sub-fields 808 which are equally spaced, although they could also be defined as described above with reference to FIG. 7. Whilst this implementation requires more calculations, and hence more time to perform, than the implementation in the first field 804, it reduces the overlay error for the whole field, even when using only a standard correction model. As such, such an approach is advantageous if a field in its entirety is intolerant of overlay error, or if a field contains a number of products or product areas, each of which may be intolerant of overlay error.

A third field 810 of the wafer 800 is located at the edge of the wafer. The field is divided into a number of sub-fields in a similar manner to the second field. However, since the field is located at the edge of the wafer, it contains a number of complete sub-fields 812 and an number of incomplete sub-fields 814. Due to the proximity of the edge of the wafer, substrate-related deviations in such a field, and accordingly any sub-fields within, differ from deviations closer to the center of the wafer. In the past, such fields have not been used for products due to the variation in deviation from more central fields. However, to increase productivity, it would be advantageous if this space too is used. By dividing the third field into a number of sub-fields and determining the overlay error on an individual sub-field basis, it is possible to utilize at least some of the sub-fields near the wafer edge for products.

Figure 9:
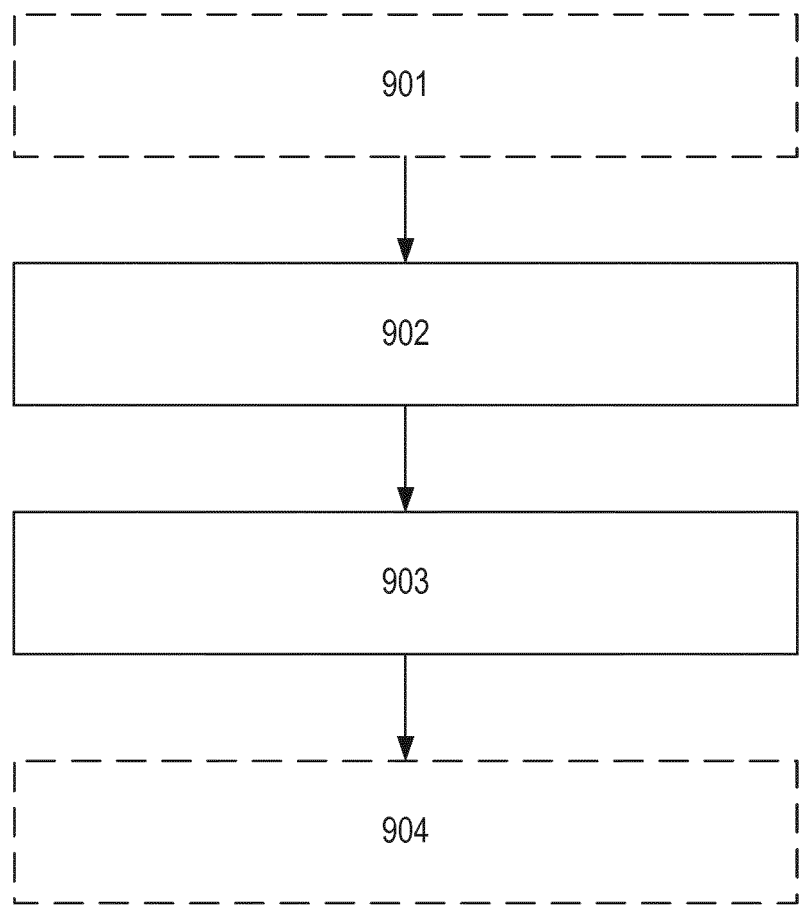
FIG. 9 is a flowchart of a sub-process of the embodiment of FIG. 6.

FIG. 9 illustrates the step of processing data relating to a sub-field of a particular exemplary implementation method described above with reference to FIG. 6 in more detail. In the this exemplary implementation, the sub-fields of the field are defined as rows transverse to the scanning direction. The reference numerals in this figure refer to the following steps, each of which will be explained in more detail in the following:

901: Obtaining intra-field fingerprint;
902: Performing simple intra-field model on entire fingerprint;
903: Performing simple intra-field on each row of fingerprint;
904: Adjusting parameters of actuators;

It is to be noted that, although the above steps are depicted in FIG. 9 and discussed below in a particular order, some of these steps may be performed in a different order, or may be performed simultaneously.

In step 901, measurement data relating to a particular field on the substrate are acquired. The measurement data typically contains data from a number of data sources, and can, for example, include (without limitation): data relating to the scanner itself; earlier measurement data (for example obtained from other substrates); or simulation data. Other data types which may be used include topography data or reticle data. In step 902, a linear intra-field correction model is applied to the fingerprint of the entire field. As previously described, a linear correction model can comprise a number of parameters which define a number of different parameters. In the present example, a correction model will be described which uses six parameters, which together define translation, rotation and scaling of the 'ideal' grid, each in two different dimensions (i.e. the x and y directions of a plane). In order to decrease the overlay error, the six-parameter correction model will in step 903, in addition to step 902 and subsequently thereto, be applied to at least one sub-field of the field fingerprint. It is to be noted that the sub-fields can be defined in any advantageous or suitable fashion. Advantageously, the sub-fields can be defined so as to contain a portion of the field wherein critical components or products, which are particularly sensitive to overlay error, are formed. Alternatively or additionally, the sub-fields are defined in order to ensure that particular parameters and/or actuators of the lithographic apparatus can be used to perform the corrections performed in step 903. As mentioned above, in the present example the sub-fields of the field are defined as rows transverse to the scanning direction (i.e. in the y-direction). On conclusion of step 903, a set of correction information has been obtained, which can be used to determine adjustments to be made to one or more of the actuators of the lithographic apparatus to control the exposure of the substrate. In step 904, the actual adjustments to the actuators are determined as a scanning operation is performed on the field. In the present exemplary implementation, adjustments in the scanning direction are implemented by adjusting the speed of the reticle stage relative to the wafer stage. Adjustments transverse to the scanning direction can be implemented by adjusting one or more lens actuators of the lens system in the apparatus. Thus, without complicating the underlying correction model, different parameters can be applied in the model, in different portions of the field.

In the above exemplary implementation, actuator adjustments are implemented by adjusting two specific actuator parameters. Depending on the specific type of apparatus used, the number and type of the actuators used to implement a specific parameter adjustment may vary.

Additionally, when the correction information has been obtained and the necessary actuator adjustments have been determined, the response function of individual actuators should be taken into account. The actuator will not be able to (fully) reduce the overlay error if the bandwidth required to correct the measured deviations exceeds the bandwidth of the relevant actuator. Reconsideration of one or more aspects of the adjustments and corrections may be performed until an optimal recipe is found.

Figure 10:
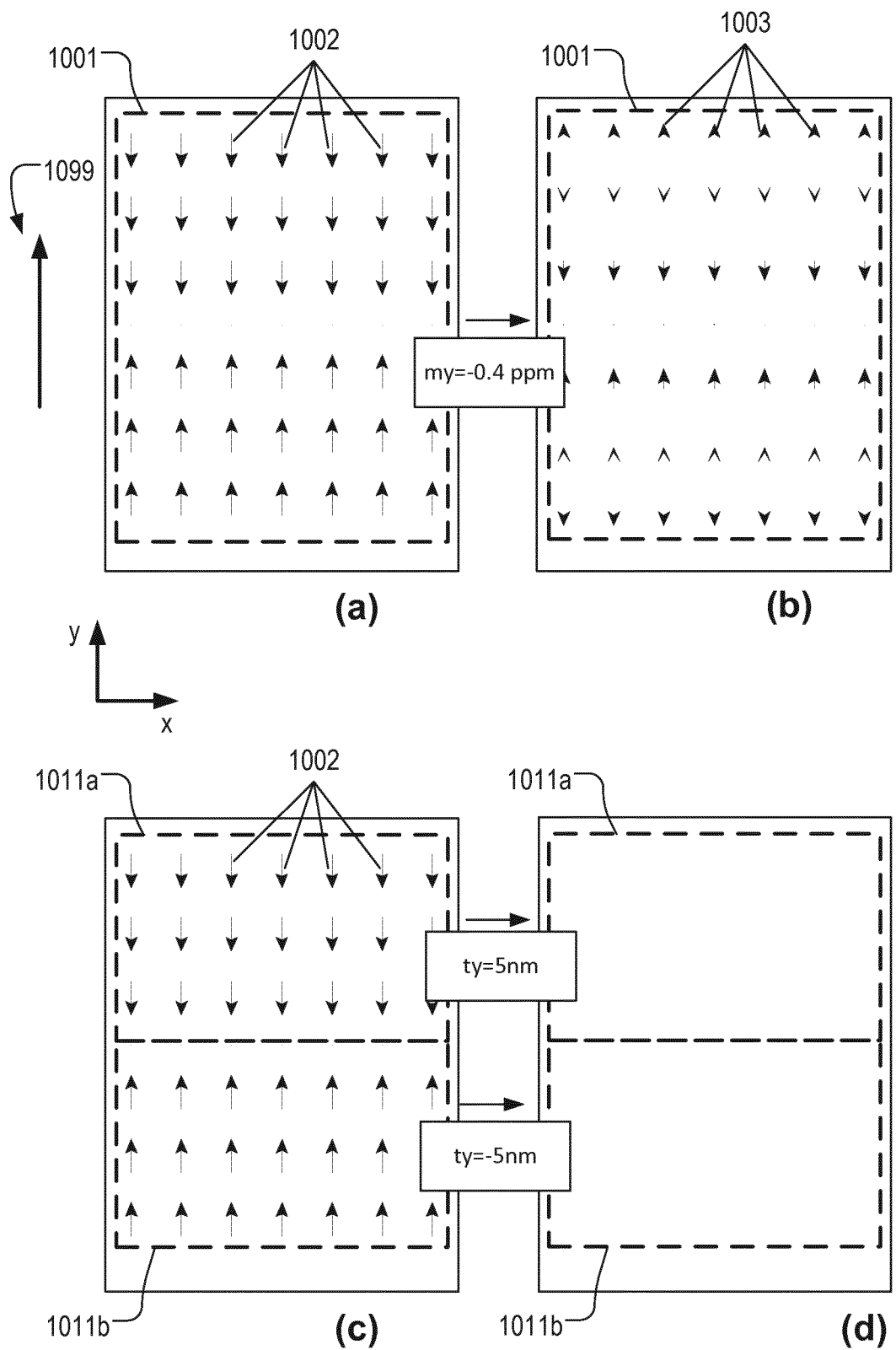
FIG. 10 is a schematic illustration of a principle of the process of FIG. 6.

FIG. 10 shows a schematic illustration of the principle of the method according to the invention. FIG. 10(a) shows an artificial intra-field fingerprint 1001 of a field. A number of measured positional deviations 1002 are shown as vectors. For illustrative purposes only, the field fingerprint includes only positional deviations in the y-direction. In reality, the deviations are, of course, not limited to deviations in a single direction. In the example, the upper half of the field deviates by −5 nm in the y-direction, and the lower half of the field deviates by 5 nm in the y-direction. In reality, of course, the residual deviations will not necessarily be such precise rounded numbers.

FIG. 10(b) shows the result obtained when a standard intra-field correction model with 6 parameters is applied to the complete sub-field fingerprint 1001 The parameters are labeled tx, ty, mx, my, rx, ry, and refer, respectively, to the translation, magnification and rotation in the x and y directions. The magnitude of the residual deviations 1003 are reduced from 5.0 nm to 2.9 nm. In this example, the model works by reducing the magnification in the y-direction. Expressing magnification in parts per million (ppm), in this example parameter my=−0.4 ppm effects the correction. The remaining parameters of the model remain neutral, i.e. tx, ty, rx, ry, mx=0. The residual deviations 1003 are thereby reduced relative to the uncorrected deviations 1002, but are not reduced to zero.

FIG. 10(c) illustrates the same artificial field fingerprint 1001 as FIG. 10(a). However, the sub-field is in this figure divided into two sub-fields 1011a and 1011b, as indicated by the respective dashed lines), which cover the upper and lower halves of the field respectively.

FIG. 10(d) shows the result obtained when the standard 6-parameter field correction model is applied separately to each of the sub-fields 1011a and 1011b. For sub-field 1011a, fitting the correction model to the measured data yields the following result: tx, mx, my, rx, ry=0, and ty=5 nm, i.e. a translation in the y-direction of 5 nm. Similarly, fitting the model for sub-field 1011b yields the result: tx, mx, my, rx, ry=0, and ty=−5 nm, i.e. a translation in the y-direction of −5 nm. As shown in FIG. 10(d), the residual deviations for both sub-fields can be cancelled entirely, rather than being reduced. Thus, by dividing the field into two sub-fields, the overlay error correction is improved over the whole-field six-parameter correction model, but without having to use a more complex model than the six-parameter field correction model, and in certain instances with better accuracy than a more complex model.

Figure 11:
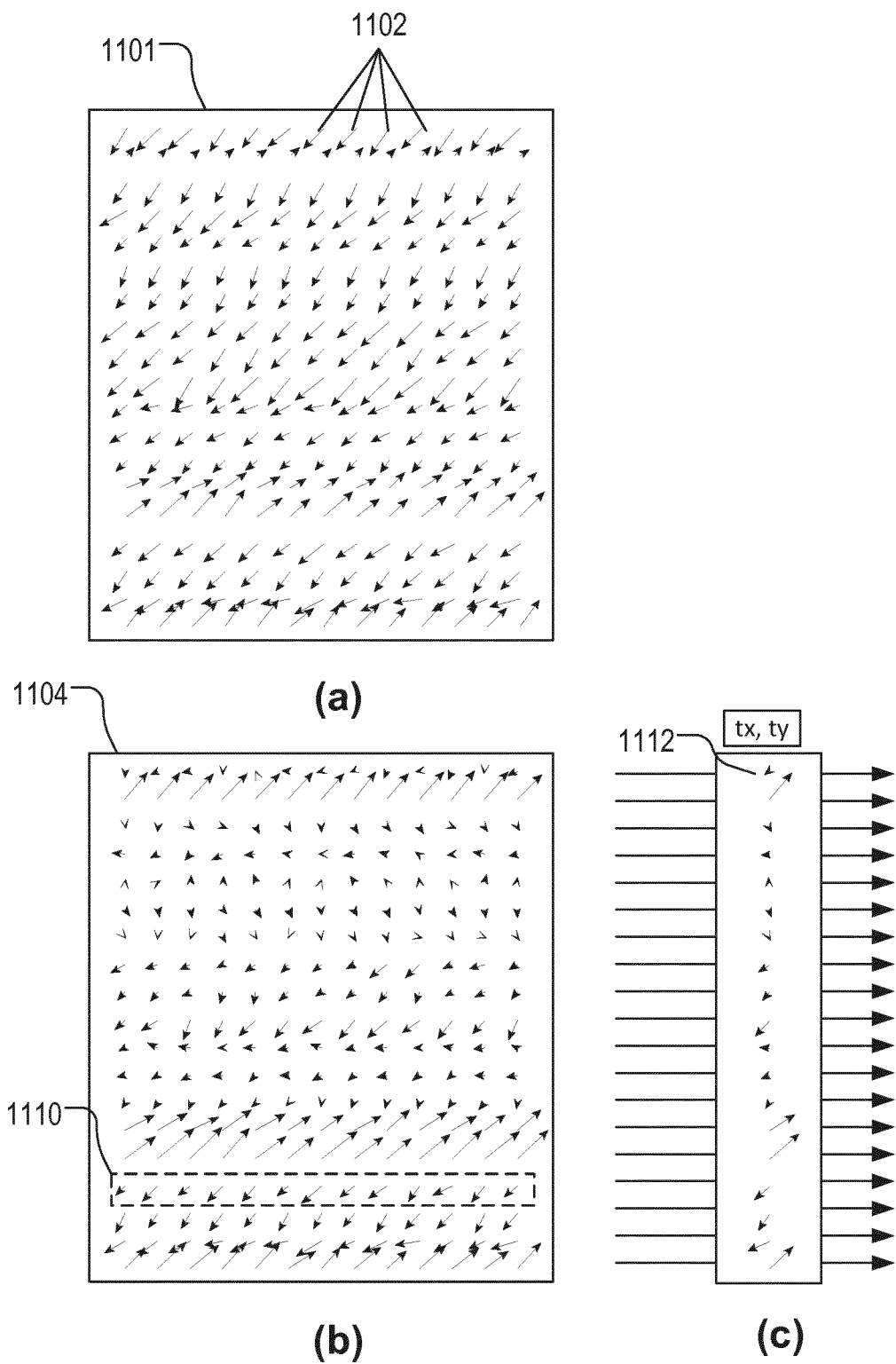
FIG. 11 is an example of the process of FIG. 6.

With reference to FIG. 11, an exemplary embodiment of the processing method of FIG. 7 will now be discussed. FIG. 11(a) illustrates an exemplary measured intra-field fingerprint 1101. Specifically, this present example contains reticle writing errors, which result in a stripe-like pattern with high spatial frequency in the Y direction. As before, each measured deviation is represented in the illustration by a vector 1102. From these measured deviations, it is possible to derive a six-parameter correction model in a conventional manner.

FIG. 11(b) illustrates the corresponding result from the six-parameter intra-field correction model 1104 when applied to the entirety of the field shown in FIG. 11(a). As previously explained, it is unlikely that the residual deviation can be completely eliminated by using the standard correction model. Indeed, in the present example, most of the deviations remain uncorrected.

In order to further reduce the residual deviation, the field is divided into a number of sub-fields, one of which is highlighted by dashed line 1110. Each of the sub-fields is defined as a single row of measurement points extending in the y-direction across the width of the field (i.e. in a direction transverse to the scanning direction). It will of course be appreciated that the sub-fields could be defined in a number of other ways, including but not limited to rows, diagonals, or other geometric shapes. However, what shapes can be applied may be limited by capabilities of the control system. In an example where the parameters of the model can be varied during a scanning operation in the y-direction, then setting the model parameters for regions other than rows or stripes may be pointless in view of the control capabilities available for the subsequent exposures. In the present example, overlay correction parameters are calculated for each sub-field using only the translation parameters (tx, ty) of the correction model. It is to be noted that this is for illustrative purposes only, and that it is possible to use any of the parameters of the model in any particular combination.

FIG. 11(c) illustrates the results of applying the correction model to each individual sub-field. Each vector 1112 represents the overlay correction parameters (tx, ty) for the corresponding sub-field (i.e. row) of the field shown in FIG. 11(a).

The resulting model parameters for each of the sub-fields shown in FIG. 11(c) are subsequently used together with the whole-field correction model 1104 to modify the settings of the corresponding actuators of the lithographical apparatus. In the present example, overlay correction parameters contain only translation components, which can be implemented in the lithographic apparatus by adjusting the relative motion between the wafer stage and the reticle stage during the scanning operation.

Figure 12:
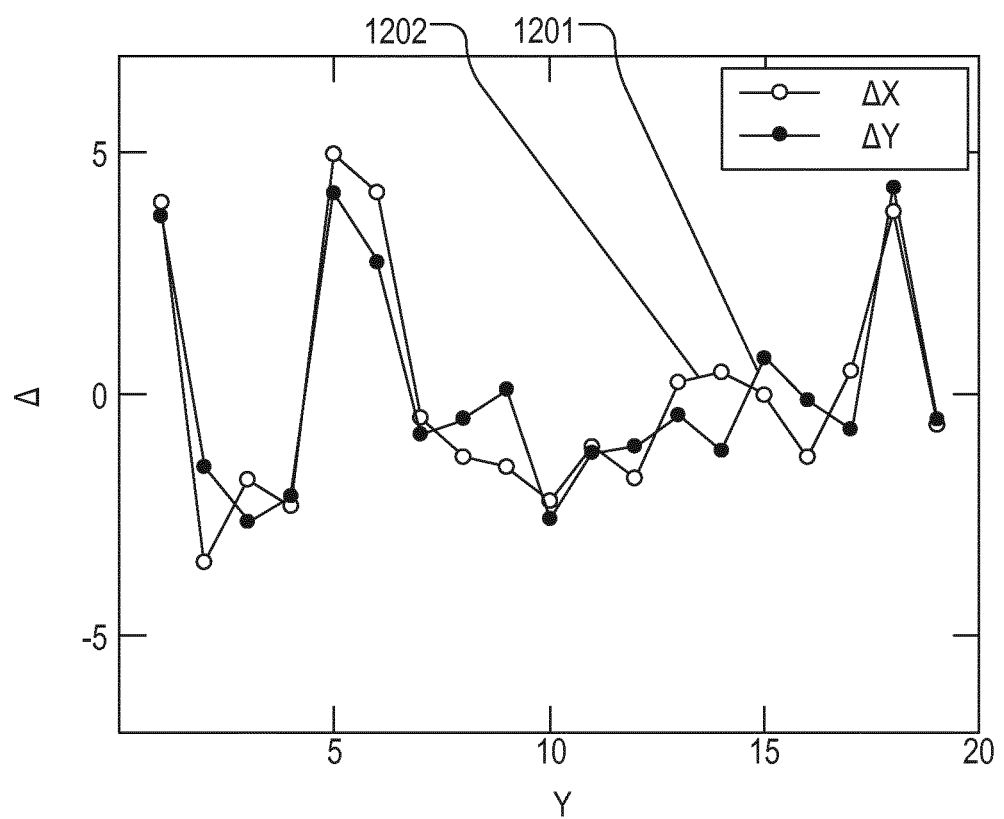
FIG. 12 is a graph showing the relative motion stages determined by the process shown in FIG. 11.

FIG. 12 shows the determined relative motion of the stages of the lithographical apparatus as a function of the scan position for the row illustrated in FIG. 11(c). The first plot 1201 illustrates the relative movement between the reticle and the substrate in the y-direction (i.e. in the scanning direction) needed to compensate for the residual deviation in the y-direction. The second plot 1202 illustrates the relative movement between the reticle and the substrate in the x-direction needed to compensate for the residual deviation in the x-direction.

Some or all of the above-mentioned functions can be fully or partially carried out on or with the aid of a suitable user-interface. The user interface can accept different types of input, either from other systems or subsystems in the apparatus or external to the apparatus. Alternatively, the user can provide input directly into the user-interface.

An example of an operation which can be carried out on a user-interface is the definition of the at least one sub-field. Determination of a sub-field is application dependent, and forms part of a product solution. As such, a sub-field definitions can be unique to a products, part of products, masks, layers or even entire families or types of technology. Such definitions can be entered automatically, for example from a database, or can be dependent on measurement data or other data determined by the apparatus.

Further, the user can specify parameters or other considerations, which may be unique to a particular substrate, for example as part of a development process. Considerations include, but are not limited to, minimizing overlay error in certain areas (such as critical areas), minimizing overlay error for an entire sub-field or field.

CONCLUSION

The method and associated inspection apparatus disclosed herein enable one or more of the following benefits.

This invention provides a high spatial frequency intra-field correction capability, so that more accurate correction is possible Enables use of new models, for example wafer edge effect models that have a large gradient By modeling sub-zone separately potential crosstalk between model parameters can be avoided, so that more accurate estimation of parameters is possible. Therefore also supports root cause analysis.

The new concept can also be applied to CD control

The sub-field corrections can be done in APC control for varying part, and can be done in a feed forward way for the static part.

Although specific reference may be made in this disclosure to the use of focus monitoring and control arrangements in inspection apparatuses such as scatterometers, it should be understood that the disclosed arrangements may have application in other types of functional apparatuses, as mentioned already above.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic method comprising:
    obtaining data about an exposure field;
    processing the data relating to a sub-field of the field using a model parameterized just to the sub-field to produce sub-field correction information; and
    correcting exposure of the sub-field using the sub-field correction information.

2. The method according to claim 1, wherein the data obtained is a fingerprint for the field.

3. The method according to claim 2, wherein the sub-field is a line of data points in the fingerprint.

4. The method according to claim 1, wherein the data obtained further includes topography, layout, structure or simulation data.

5. The method according to claim 1, wherein the data is obtained separately from exposing or at the same time.

6. The method according to claim 1, wherein the obtained data further includes reticle data.

7. The method according to claim 1, further comprising processing all or substantially all of the data obtained to produce complete field correction information, and correcting exposure of the complete field using the complete field correction information.

8. The method according to claim 1, wherein the correction information comprises a set of corrections from the model.

9. The method according to claim 1, comprising:
    processing data relating to a number of sub-fields to produce sub-field correction information for each sub-field; and
    correcting exposure of each sub-field using correction information for that sub-field.

10. The method according to claim 9, wherein exposure of a number of sub-fields is corrected at the same time or one after the other.

11. A lithographic apparatus configured to perform the method according to claim 1.

12. A non-transitory computer program product containing one or more sequences of machine-readable instructions, when executed by a computer system, configured to control a lithographic apparatus system to at least:
    obtain data about an exposure field;
    process the data relating to a sub-field of the field using a model parameterized just to the sub-field to produce sub-field correction information; and
    determine a correction for exposure of the sub-field using the sub-field correction information.

13. The computer program product according to claim 12, wherein the computer program provides a user interface for use by an operator in defining one or more sub-fields.

14. The computer program product according to claim 13 wherein the user interface provides for the operator to identify one or more portions of the field where performance of the exposure is to be optimized.

15. The computer program product according to claim 13 wherein the user interface is arranged to constrain choices of sub-fields in accordance with responses of specific actuators within the particular lithographic apparatus system.

16. The computer program product according to claim 13, wherein the data obtained is a fingerprint for the field.

17. The computer program product according to claim 13, wherein the data obtained further includes topography, layout, structure or simulation data.

18. The computer program product according to claim 13, wherein the obtained data further includes reticle data.

19. The computer program product according to claim 13, wherein the instructions are further configured to cause the lithographic apparatus system to process all or substantially all of the data obtained to produce complete field correction information, and correct exposure of the complete field using the complete field correction information.

20. The computer program product according to claim 13, wherein the correction information comprises a set of corrections from the model.

* * * * *